US 9,269,651 B2

(12) United States Patent
Hong et al.

(10) Patent No.: US 9,269,651 B2
(45) Date of Patent: Feb. 23, 2016

(54) HYBRID TSV AND METHOD FOR FORMING THE SAME

(71) Applicant: GLOBALFOUNDRIES Singapore PTE LTD, Singapore (SG)

(72) Inventors: Yu Hong, Singapore (SG); Liu Huang, Singapore (SG); Zhao Feng, Singapore (SG)

(73) Assignee: GLOBALFOUNDRIES Singapore PTE LTD, Singapore (SG)

( * ) Notice: Subject to any disclaimer, the term of this patent is extended or adjusted under 35 U.S.C. 154(b) by 0 days.

(21) Appl. No.: 14/631,240

(22) Filed: Feb. 25, 2015

(65) Prior Publication Data
US 2015/0179547 A1   Jun. 25, 2015

Related U.S. Application Data

(62) Division of application No. 13/091,277, filed on Apr. 21, 2011, now Pat. No. 9,006,102.

(51) Int. Cl.
*H01L 23/48* (2006.01)
*H01L 21/768* (2006.01)
(Continued)

(52) U.S. Cl.
CPC ........ *H01L 23/481* (2013.01); *H01L 21/76847* (2013.01); *H01L 21/76877* (2013.01); *H01L 21/76898* (2013.01); *H01L 23/528* (2013.01); *H01L 23/53238* (2013.01); *H01L 23/53257* (2013.01); *H01L 2924/0002* (2013.01); *H01L 2924/00013* (2013.01)

(58) Field of Classification Search
CPC ....................................................... H01L 23/528
USPC .......................................................... 257/774
See application file for complete search history.

(56) References Cited

U.S. PATENT DOCUMENTS

| 2001/0035578 | A1 | 11/2001 | Liang et al. |
| 2008/0142990 | A1* | 6/2008 | Yu ........................ H01L 21/8221 257/777 |
| 2008/0315418 | A1 | 12/2008 | Boyd et al. |

(Continued)

FOREIGN PATENT DOCUMENTS

CN          101079408 A      11/2007

OTHER PUBLICATIONS

Office Action dated Mar. 5, 2014 from Chinese Intellectual Property Office for CN Application No. 201210120792.7.
(Continued)

*Primary Examiner* — Long K Tran
(74) *Attorney, Agent, or Firm* — Amerson Law Firm, PLLC

(57) ABSTRACT

A semiconductor chip includes a substrate and a semiconductor layer positioned above the substrate. A hybrid through-silicon via ("TSV") extends continuously through at least the semiconductor layer and the substrate and includes a first TSV portion and a second TSV portion. A lower portion of the first TSV portion is positioned in the substrate and has a lower surface adjacent to a back side of the substrate and an upper surface below the semiconductor layer. Upper sidewall portions of the first TSV portion extend from the upper surface through at least the semiconductor layer. A depth of the lower portion is greater than a thickness of the upper sidewall portions. The second TSV portion is conductively coupled to the first TSV portion, is laterally surrounded by the upper sidewall portions, and extends continuously from the upper surface through at least the semiconductor layer.

20 Claims, 6 Drawing Sheets

(51) Int. Cl.
*H01L 23/528* (2006.01)
*H01L 23/532* (2006.01)

(56) References Cited

U.S. PATENT DOCUMENTS

2010/0264548 A1 10/2010 Sanders et al.
2011/0073997 A1 3/2011 Leuschner et al.

OTHER PUBLICATIONS

Mercha et al., "Comprehensive Analysis of the Impact of Single and Arrays of Through Silicon Vias Induced Stress on High-k/Metal Gate CMOS Performance," IEEE, IEDM10-26-29, 2010.

Motoyoshi, "Through-Silicon Via (TSV)," Proceedings of the IEEE, 97:43-48, 2009.

Olmen et al., "3D Stacked IC Demonstration Using a Through Silicon Via First Approach," IEEE, pp. 603-606, 2008.

Pozder et al., "Progress of 3D Integration Technologies and 3D Interconnects," IEEE, pp. 213-215, 2007.

Teh et al., "Magnetically-enhanced capacitively-coupled plasma etching for 300 mm wafer-scale fabrication of Cu through-silicon-vias for 3D logic integration," IEEE, pp. 53-55, 2009.

Inoue et al., "Study of Low Resistance TSV Using Electroless Plated Copper and Tungsten-alloy Barrier," IEEE, pp. 167-168, 2009.

* cited by examiner

HYBRID TSV AND METHOD FOR FORMING THE SAME

CROSS-REFERENCE TO RELATED APPLICATION

This is a divisional of co-pending application Ser. No. 13/091,277, filed Apr. 21, 2011.

BACKGROUND

1. Field of the Disclosure

Generally, the present disclosure relates to sophisticated integrated circuits, and, more particularly, to structures and manufacturing methods for forming through-silicon vias.

2. Description of the Related Art

In recent years, the device features of modern, ultra-high density integrated circuits have been steadily decreasing in size in an effort to enhance the overall speed, performance, and functionality of the circuit. As a result, the semiconductor industry has experience tremendous growth due to the significant and ongoing improvements in integration density of a variety of electronic components, such as transistors, capacitors, diodes, and the like. These improvements have primarily come about due to a persistent and successful effort to reduce the critical dimension—i.e., minimum feature size—of components, directly resulting in the ability of process designers to integrate more and more components into a given area of a semiconductor chip.

Improvements in integrated circuit design have been essentially two-dimensional (2D)—that is, the improvements have been related primarily to the layout of the circuit on the surface of a semiconductor chip. However, as device features are being aggressively scaled, and more semiconductor components are being fit onto the surface of a single chip, the required number of electrical interconnects necessary for circuit functionality dramatically increases, resulting in an overall circuit layout that is increasingly becoming more complex and more densely packed. Furthermore, even though improvements in photolithography processes have yielded significant increases in the integration densities of 2D circuit designs, simple reduction in feature size is rapidly approaching the limit of what can presently be achieved in only two dimensions.

As the number of electronic devices on single chip rapidly increases, three-dimensional (3D) integrated circuit layouts, or stacked chip design, have been utilized for some semiconductor devices in an effort to overcome some of the feature size and density limitations associated with 2D layouts. Typically, in a 3D integrated circuit design, two or more semiconductor dies are bonded together, and electrical connections are formed between each die. One method of facilitating the chip-to-chip electrical connections is by use of so-called through-silicon vias, or TSV's. A TSV is a vertical electrical connection that passes completely through a silicon wafer or die, allowing for more simplified interconnection of vertically aligned electronic devices, thereby significantly reducing integrated circuit layout complexity as well as the overall dimensions of a multi-chip circuit. A typical prior art process for forming TSV's is illustrated in FIGS. 1a-1f, and will now be discussed in detail below.

FIG. 1a is a schematic cross-sectional view depicting one stage in the formation of a TSV in accordance with an illustrative prior art process. As shown in FIG. 1a, a semiconductor chip or wafer 100 may comprise a substrate 101, which may represent any appropriate carrier material above which may be formed a semiconductor layer 102. Additionally, a plurality of schematically depicted active and/or passive circuit elements 103, such as transistors, capacitors, resistors and the like, may be formed in and above the semiconductor layer 102, in which case the semiconductor layer 102 may also be referred to as a device layer 102. Depending on the overall design strategy of the wafer 100, the substrate 101 may in some embodiments be comprised of a substantially crystalline substrate material (i.e., bulk silicon), whereas in other embodiments the substrate 101 may be formed on the basis of a silicon-on-insulator (SOI) architecture, in which a buried insulating layer 101a may be provided below the device layer 102. It should be appreciated that the semiconductor/device layer 102, even if comprising a substantially silicon-based material layer, may include other semiconducting materials, such as germanium, carbon and the like, in addition to appropriate dopant species for establishing the requisite active region conductivity type for the circuit elements 103.

FIG. 1a also illustrates a contact structure layer 104, which may be formed above the device layer 102 so as to provide electrical interconnects between the circuit elements 103 and a metallization system (not shown) to be formed above the device layer 102 during subsequent processing steps. For example, one or more interlayer dielectric (ILD) layers 104a may be formed above the device layer 102 so as to electrically isolate the respective circuit elements 103. The ILD layer 104a may comprise, for example, silicon dioxide, silicon nitride, silicon oxynitride, and the like, or a combination of these commonly used dielectric materials. Furthermore, depending on the device design and overall process flow requirements, the interlayer dielectric layer 104a may also comprise suitably selected low-k dielectric materials, such as porous silicon dioxide, organosilicates, organic polyimides, and the like. Thereafter, the ILD layer 104a may be patterned to form a plurality of via openings, each of which may be filled with a suitable conductive material such as tungsten, copper, nickel, silver, cobalt and the like (as well as alloys thereof), thereby forming contact vias 105. Additionally, in some embodiments, trench openings may also be formed in the ILD layer 104a, which may thereafter be filled with a similar conductive material such as noted for the contact vias 105 above, thereby forming conductive lines 106.

As shown in FIG. 1a, in certain embodiments, a hardmask layer 107, which may act as a stop layer for a subsequently performed chemical mechanical polishing (CMP) process, may thereafter be formed above the contact structure layer 104. The hardmask layer 107 may comprise a dielectric material having an etch selectivity relative to at least the material comprising the upper surface portion of the ILD layer 104a, such as silicon nitride, silicon oxynitride, and the like. In some illustrative embodiments, the hardmask layer 107 may be formed above the contact structure layer 104 by performing a suitable deposition processes based on parameters well known in the art, such as a chemical vapor deposition (CVD) process, a physical vapor deposition (PVD) process, and the like. Thereafter, a patterned resist mask layer 108 may be formed above the hardmask layer 107 based on typical photolithography processes, such as exposure, baking, developing, and the like, so as to provide openings 108a in the mask layer 108, thereby exposing the hardmask layer 107.

FIG. 1b shows the illustrative prior art process of FIG. 1a in a further manufacturing stage, wherein an etch process 109 is performed to create TSV openings 110 in the wafer 100. As shown in FIG. 1b, the patterned resist mask layer 108 may be used as an etch mask during the etch process 109 to form openings in the hardmask layer 107, and to expose the ILD layer 104a of the contact structure layer 104. Thereafter, the etch process 109 may be continued, and the patterned mask layer 108 and patterned hardmask layer 107 may be used as mask elements to form the TSV openings 110 through the contact structure layer 104, through the device layer 102, and into the substrate 101. In certain embodiments, the etch process 109 may be a substantially anisotropic etch process, such as a deep reactive ion etch (REI), and the like. Depending on the chip design considerations and etch parameters employed during the etch process 109, the sidewalls 110s of the TSV openings 110 may be substantially vertical with respect to the front and back surfaces 100f, 100b of the wafer 100 (as shown in FIG. 1b), whereas in some embodiments the sidewalls 110s may be slightly tapered, depending on the depth of the TSV openings 110 and the specific etch recipe used to perform the etch process 109. Moreover, since the TSV openings 110 may pass through and/or into a plurality of different material layers, such as the ILD layer 104a, the device layer 102, a buried insulation layer 101a (when used), and the substrate 101, the etch process 109 may be substantially non-selective with respect to material type, such that a single etch recipe may be used throughout the duration of the etch.

Depending on the overall processing and chip design parameters, the openings 110 may have a width dimension 110w ranging from 1-10 µm, a depth dimension 110d ranging from 5-50 µm or even more, and an aspect ratio—i.e., depth-to-width ratio—ranging between 4 and 25. In one embodiment, the width dimension 110w may be approximately 5 µm, the depth dimension 110d may be approximately 50 µm, and the aspect ratio approximately 10. Typically, however, and as shown in FIG. 1b, the TSV openings 110 do not, at this stage of fabrication, extend through the full thickness of the substrate 101, but instead stop short of the back surface 100b of the wafer 100. For example, in some embodiments, the etch process 109 is continued until the bottom surfaces 110b of the TSV openings 110 come within a range of approximately 1-20 µm of the back surface 100b. Additionally, and as will be discussed in further detail below, after the completion of processing activities above the front side 100f of the wafer 100, such as processing steps to form a metallization system above the contact structure layer 104 and the like, the wafer 100 is thinned from the back side 100b so as to expose the finished TSV's 120 (see FIG. 1f).

FIG. 1c shows a further advanced step of the illustrative prior art method illustrated in FIG. 1b after the patterned resist mask layer 108 has been removed from above the hardmask layer 107. Depending on the overall chip configuration and design considerations, an isolation layer 111 may be formed on the exposed surfaces of the TSV openings 100 so as to eventually electrically isolate the finished TSV's 120 (see FIG. 1f) from the substrate 101, the device layer 102, and/or the contract structure layer 104. As shown in FIG. 1c, the isolation layer 111 may be formed above all exposed surfaces of the wafer 100, including the upper surface 107u of the hardmask layer 107, and the sidewall and bottom surfaces 110s, 110b of the TSV openings 110. In certain embodiments, the isolation layer 111 may be formed by performing a suitable conformal deposition process 131 so as to deposit an appropriate dielectric insulating material layer having a substantially uniform thickness on the exposed surfaces of the TSV openings 110.

For example, in some embodiments, the isolation layer 111 may be formed of silicon dioxide, and the deposition process 131 may be any one of several deposition techniques well known in the art, such as low-pressure chemical vapor deposition (LPCVD), atmospheric-pressure chemical vapor deposition (APCVD), plasma-enhanced chemical vapor deposition (PECVD), and the like. In certain embodiments, the isolation layer 111 may comprise silicon dioxide, and may be deposited based on tetraethylorthosilicate (TEOS) and $O_3$ (ozone) using LPCVD or PECVD processes. Additionally, the as-deposited thickness of the isolation layer 111 may be as required to ensure that the TSV 120 (see FIG. 1f) is electrically isolated from the surrounding layers of the wafer 100. For example, in some illustrative embodiments the isolation layer 111 may range in thickness from 20-100 nm, or even greater.

FIG. 1d depicts the illustrative prior art method of FIG. 1c after a barrier layer 112 has been formed above the wafer 100. In some embodiments, the barrier layer 112 may serve to prevent the conductive material comprising the finished TSV's 120 (see FIG. 1f) from diffusing into and/or through the isolation layer 111, or into and/or through the ILD layer 104a, a situation that could significantly affect the overall performance of the circuit elements 103, the contact vias 105, and/or the conductive lines 106. Furthermore, the barrier layer 112 may also act as an adhesion layer, thereby potentially enhancing that overall bond between the contact material of the finished TSV's 120 and the underlying dielectric isolation layer 111.

As shown in FIG. 1d, the barrier layer 112 may be formed above all exposed surfaces of the isolation layer 111, including the exposed surfaces inside of the TSV openings 110. In certain illustrative embodiments, the barrier layer 112 may be deposited above the isolation layer 111 by performing a substantially conformal deposition process 132, such as CVD, PVD, ALD (atomic layer deposition) and the like. Depending on device requirements and TSV design parameters, the barrier layer 112 may comprise any one of a number of suitable barrier layer materials well known in the art to reduce and/or resist the diffusion of metal into a surrounding dielectric, such as tantalum (Ta), tantalum nitride (TaN), titanium (Ti), titanium nitride (TiN), titanium silicon nitride (TiSiN), tungsten nitride (WN), and the like. Furthermore, due to the relatively large width 110w of the TSV openings 110 as compared to a contact via used to form an electrical interconnection to a typical integrated circuit element—such as the contact vias 105—the thickness of the barrier layer 112 may not be critical to the overall performance characteristics of the TSV's 120 (see FIG. 1f). Accordingly, the thickness of the barrier layer 112 may in some illustrative embodiments range between 2 nm and 20 nm, depending on the material type and deposition method used to form the barrier layer 112.

After the barrier layer 112 has been formed above the exposed surfaces of the isolation layer 111, a layer of conductive contact material 113 may then be formed above the wafer 100 so as to completely fill the TSV openings 110, as shown in FIG. 1e. Depending on the TSV design requirements, the layer of conductive contact material 113 may be substantially comprised of copper, or in certain embodiments may comprise a suitable copper alloy. In some embodiments, the TSV openings 110 may be filled with the layer of conductive contact material 113 based on a substantially "bottom-up" deposition process 133 well known to those skilled in the art, such as a suitably designed electrochemical plating (ECP) process and the like, thereby reducing the likelihood that voids may be formed and/or trapped in the finished TSV's 120 (see FIG. 1f). In other illustrative embodiments, an electroless plating process may be employed. Additionally, and depending on the type of material used for the barrier layer 112 and the type of deposition process 133 used to fill the TSV openings 110, a seed layer (not shown) may be formed on the barrier layer 112 prior to performing the deposition process 133. In certain embodiments, the optional seed layer may be deposited using a highly conformal deposition process, such as sputter deposition, ALD, and the like, and may have a thickness ranging from approximately 5-10 nm. However, in other illustrative embodiments, the thickness of the barrier layer 133 may be even greater—for example, from 10-15 nm—whereas in still other embodiments, the thickness may be even less—for example, from 1-5 nm. Depending on the processing requirements, still other barrier layer thicknesses may be used.

It should be noted that, as a result of the "bottom-up" deposition process 133 used to fill the TSV openings 110 in some prior art processes, depressions 114 in the layer of conductive contact material 113 having a depth 114a may be present above each of the TSV openings 110 after completion of the deposition process 133. Accordingly, as shown in FIG. 1e, a significant amount of material "overburden" 113b, or additional thickness, may need to be deposited outside of the TSV openings 110 and above the upper horizontal surfaces 100s of the wafer 100 to ensure that the TSV openings 110 are completely filled with the layer of conductive contact material 113. In some embodiments, the depth 114a may be as much as one-half of the thickness of the overburden 113b, or even greater. Furthermore, in order to ensure that the depth 114a of the depressions 114 in the conductive contact material layer 113 does not encroach into the TSV openings 110, the overburden 113b may need to at least equal, if not exceed, the depth 114a. Depending on the width 110w, depth 110d, and aspect ratio of the TSV openings 110, the overburden 113b may in some illustrative embodiments range from 1-3 μm, or even greater. However, it should be noted that when such a large conductive contact layer overburden thickness is necessary in order to ensure complete filling of the TSV openings 110, the effectiveness of any subsequently performed planarization processes, such as CMP processes and the like, can be severely impacted, as discussed in detail below.

FIG. 1f shows the illustrative prior art process of FIG. 1e in a further advanced manufacturing stage. As shown in FIG. 1f, a planarization process 140, such as a CMP process and the like, may be performed to remove the horizontal portion of the layer of conductive contact material 113 formed outside of the TSV openings 110 from above the wafer 100. Furthermore, in some embodiments the horizontal portions of the isolation layer 111 formed above the wafer 100 and outside of the TSV openings 110 may also be removed during the planarization process 140. Moreover, the thickness of the hardmask layer 107, which as noted previously may act as a CMP stop layer, may also be reduced during the planarization process 140. After completion of the planarization process 140, additional processing of the front side 100f of the wafer 100 may be performed, such as forming metallization layers and the like above the TSV's 120 and the contact structure layer 104. Thereafter, the wafer 100 may be thinned from the back side 100b so as to reduce the thickness of the substrate 101 (indicated in FIG. 1f by dashed line 101t) and expose the bottom surfaces 120b of the TSV's 120 in preparation for wafer stacking and substrate bonding—i.e., 3D integrated circuit assembly.

As noted previously, a layer of conductive contact material 113 having large amount of overburden 113b formed outside of the TSV openings 110 may substantially impact the overall effectiveness of the planarization process 140. Due to this large amount of overburden 113b, highly aggressive CMP parameters may be necessary to ensure complete removal of the excess conductive contact material 113 from above the horizontal surfaces of the wafer 100. As shown in FIG. 1f, these highly aggressive CMP parameters may cause the presence of the depression 114 (see FIG. 1e) to translate into a dished region 115 having a depth 115a at the upper end of each TSV 120 after completion of the planarization process 140—a phenomenon well known in the art of chemical mechanical polishing. In some embodiments, the depth 115a of the dished region 115 may exceed 100 nm or more, and under certain conditions—such as the depth 114a of the original depression 114, the CMP recipe, and the like—the depth 115a may be as large as 200 nm, or even greater. Furthermore, the presence of the dished region 115 in the TSV's 120 may translate into additional defects in the layers of a metallization system (not shown) subsequently formed above the TSV's 120 and the contact structure layer 104, such as voids, gaps, and additional depressions and/or dished regions, thereby potentially leading to decreased product yield and reduced product performance.

TABLE 1

Approximate Bulk Linear Coefficients of Thermal Expansion for Selected Materials

| Conductive Material | CTE (μm/m/° C.) | Semiconductor-Based Material | CTE (μm/m/° C.) |
|---|---|---|---|
| Tungsten | 4.3 | Silicon | 2.6 |
| Tantalum | 6.5 | Germanium | 5.8 |
| Titanium | 8.6 | Silicon-Germanium | 3.4-5.0 |
| Platinum | 9.0 | Silicon Dioxide | 0.5 |
| Cobalt | 12.0 | Silicon Nitride | 3.3 |
| Nickel | 13.0 | Silicon Carbide | 4.0 |
| Gold | 14.2 | | |
| Copper | 16.6 | | |
| Silver | 19.5 | | |
| Aluminum | 22.2 | | |

Additionally, due to the significant difference in the coefficient of thermal expansion (CTE) between copper—which may be a major material constituent in some TSV's—and that of many of the materials commonly used in semiconductor processing, such as silicon, germanium, silicon dioxide, silicon nitride and the like, significant thermal stresses may be induced in the circuit elements surrounding TSV's during normal operation. For example, Table 1 above lists some approximate representative values of the bulk linear coefficient of thermal expansion (CTE) of several materials that may commonly be used in the manufacture of semiconductor devices, graphically illustrating the difference between the CTE of conductive materials that might commonly be used for forming TSV's, and that of the semiconductor-based materials which might comprise the majority of many device layers and circuit elements.

As can be seen from the approximate CTE data presented in Table 1 above, the coefficient of expansion of a typical conductive material such as copper ranges anywhere from approximately 3 to 30 times greater than the CTE of typical semiconductor-based materials, which during normal device operation could result in a significant differential thermal expansion, and commensurately high thermal stresses in the areas surrounding TSV's. Additionally, due to the tremendous size disparity between that of a typical TSV (sizes on the order of μm's) vs. that of a typical modern integrated circuit elements (sizes on the order of nm's)—a disparity that may approach three orders of magnitude—the thermal stresses induced in any circuit elements proximate the TSV's may be even further exacerbated. Furthermore, as noted previously, TSV's may typically be used in 3D integrated circuit layouts to provide electrical interconnection between various stacked chips, and as such the amount power transmitted through the TSV's may result in a significant temperature increase in the area surrounding the TSV's during normal operation of a stacked chip. Each of these factors—relative size disparity between TSV's and circuit elements, difference in CTE, and elevated temperature during chip operation—may have a significant effect on the level of thermal stress 125 (see FIG. 1f) that may be induced in the circuit elements 203 near the TSV's, and a subsequent reduction in device performance and overall chip life. Moreover, these problems may be compounded in and around the device layers and contact structure layers of a chip, which may comprise low-k dielectric materials having a lower overall material strength and a lower resistance to thermally induced stresses, possibly resulting in further reduced product quality and performance.

Accordingly, there is a need to implement new design strategies to address the manufacturing and performance issues associated with the overall configuration of TSV's, as well and the typical methods used for forming TSV's. The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to semiconductor chips having conductive via elements, such as through-silicon vias (TSV's) and the like, and methods for forming the same. One illustrative semiconductor chip disclosed herein includes a substrate, a semiconductor layer positioned above the substrate, and a hybrid through-silicon via ("TSV") that extends continuously through at least the semiconductor layer and the substrate. The hybrid TSV includes, among other things, a first TSV portion of a first conductive contact material, wherein the first TSV portion includes a lower portion that is positioned in the substrate. The first TSV portion has a lower surface that is positioned adjacent to a back side of the substrate and an upper surface that is positioned below the semiconductor layer. Additionally, the first TSV portion also includes upper sidewall portions that extend from the upper surface of the lower portion through at least the semiconductor layer, wherein a depth of the lower portion between the upper and lower surfaces is greater than a thickness of the upper sidewall portions. The hybrid TSV also includes a second TSV portion of a second conductive contact material, wherein the second TSV portion is conductively coupled to the first TSV portion, is laterally surrounded by the upper sidewall portions, and extends continuously from the upper surface of the lower portion through at least the semiconductor layer.

Also disclosed herein is an exemplary semiconductor chip that includes a hybrid through-silicon via ("TSV"), wherein the hybrid TSV includes, among other things, a first lower TSV portion, a first upper TSV portion, and a second TSV portion. The first lower TSV portion includes a first conductive contact material that has a first coefficient of thermal expansion and is positioned in a substrate of the semiconductor chip. A lower surface of the first lower TSV portion is exposed at a back side of the substrate and an upper surface of the first lower TSV is positioned below a device layer of the semiconductor chip. The first upper TSV portion includes sidewall portions that extend above the upper surface of the first lower TSV portion and through at least the device layer and a contact structure layer of the semiconductor chip that is positioned above the device layer, wherein a depth of the first lower TSV portion between the upper and lower surfaces thereof is greater than a thickness of the sidewall portions. The second TSV portion is conductively coupled to the first upper and lower TSV portions and comprises a second conductive contact material having a second coefficient of thermal expansion that is less than the first coefficient of thermal expansion. Furthermore, the second TSV portion is laterally surrounded by the sidewall portions of the first upper TSV portion and extends continuously above the upper surface of the first lower TSV portion through at least the device layer and the contact structure layer.

In yet another illustrative embodiment of the present disclosure, an exemplary semiconductor chip includes a substrate, a semiconductor layer positioned above the substrate, an interlayer dielectric layer positioned above the semiconductor layer, and a hybrid through-silicon via ("TSV") extending continuously through an entirety of the interlayer dielectric layer, the semiconductor layer and the substrate. The hybrid TSV includes, among other things, a lower TSV portion and an upper TSV portion. The lower TSV portion is positioned entirely in a lower portion of the substrate and comprises a first conductive material having a first thermal expansion coefficient. Furthermore, the lower TSV portion has a lower surface that is exposed at a back side of the substrate and an upper surface that is positioned below the semiconductor layer. The upper TSV portion includes an inner core portion and an outer layer portion surrounding an entirety of the inner core portion, wherein a depth of the lower TSV portion measured between the upper and lower surfaces thereof is greater than a lateral thickness of the outer layer portion of the upper TSV portion. Additionally, the outer layer portion comprises the first conductive material and the inner core portion comprises a second conductive material having a second thermal expansion coefficient that is less than approximately 50% of the first thermal expansion coefficient.

BRIEF DESCRIPTION OF THE DRAWINGS

The disclosure may be understood by reference to the following description taken in conjunction with the accompanying drawings, in which like reference numerals identify like elements, and in which.

Figure 1A:
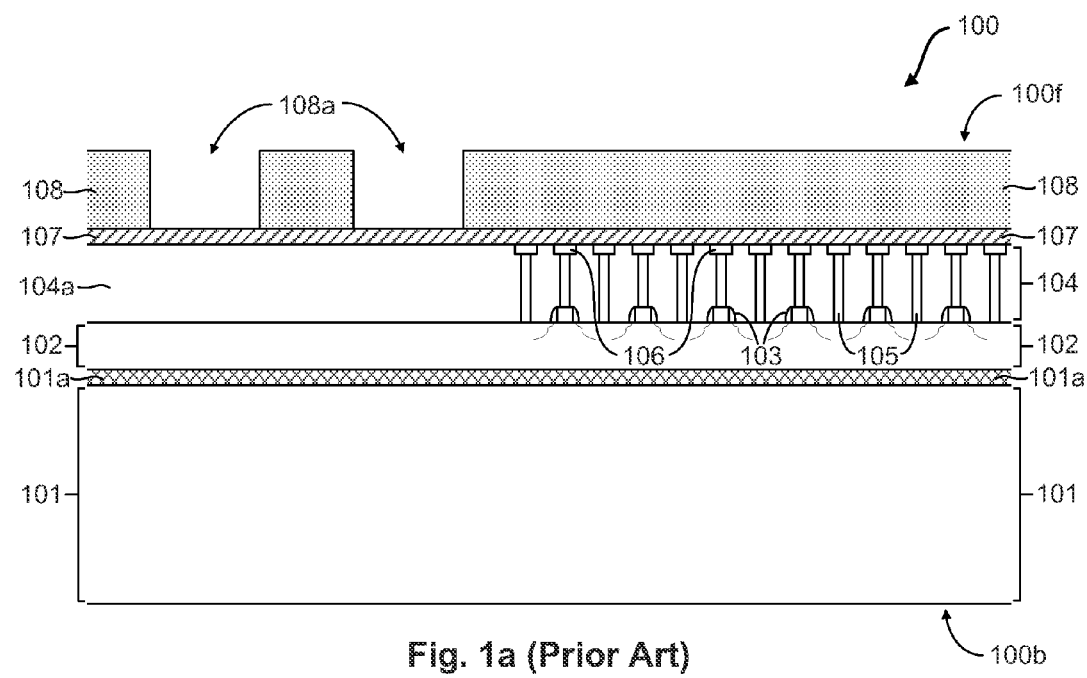
FIGS. 1a-1f schematically illustrate a process flow of an illustrative prior art method for forming TSV's in a semiconductor wafer.
Figure 1B:
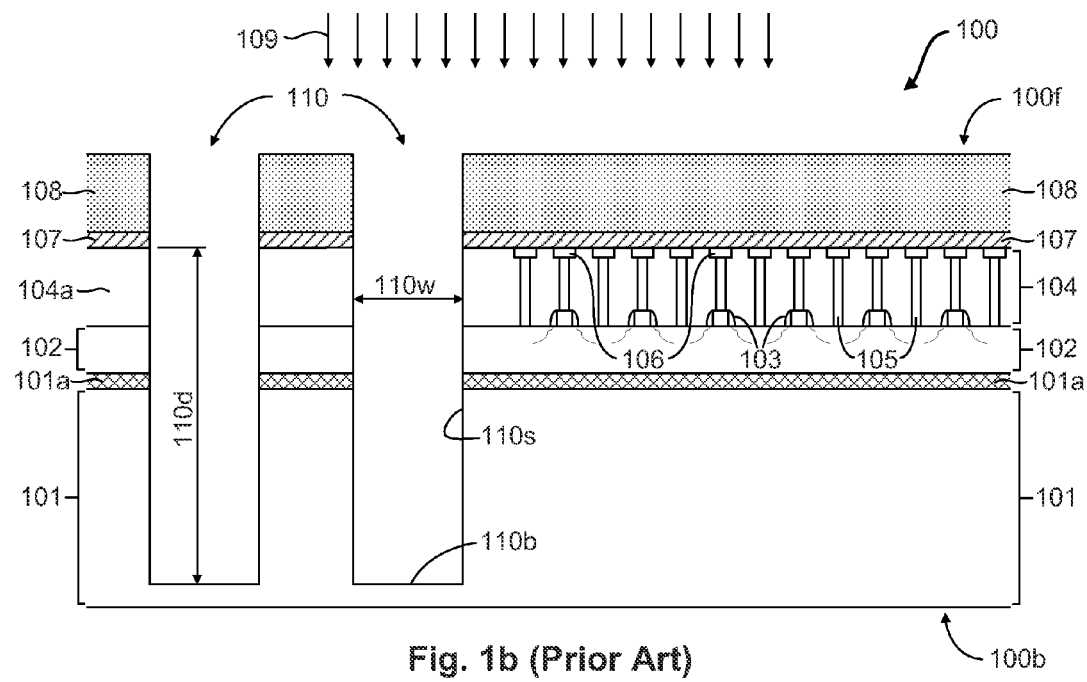
Figure 1C:
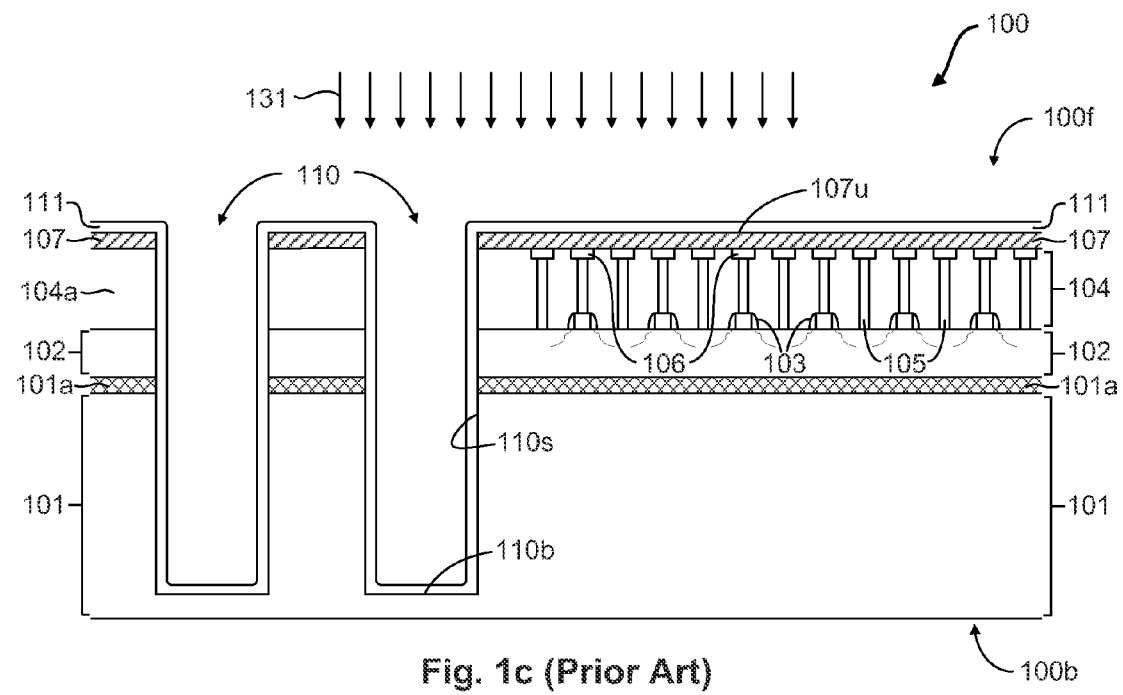

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides various embodiments of manufacturing techniques and semiconductor devices wherein hybrid through-silicon vias (TSV's) are formed in a semiconductor wafer. It should be noted that, where appropriate, the reference numbers used in describing the various elements shown in the illustrative embodiments of FIGS. 2a-2e substantially correspond, where appropriate to the reference numbers used in describing related elements illustrated in FIGS. 1a-1f above, except that the leading numeral in each figure has been changed from a "1" to a "2." For example, wafer "100" corresponds to wafer "200," substrate "101" corresponds to substrate "201," device layer "102" corresponds to device layer "202," and so on. Accordingly, the reference number designations used to identify some elements of the presently disclosed subject matter may be illustrated in the FIGS. 2a-2e but may not be specifically described in the following disclosure. In those instances, it should be understood that the numbered elements shown in FIGS. 2a-2e which are not described in detail below substantially correspond with their like-numbered counterparts illustrated in FIGS. 1a-1f, and described in the associated disclosure set forth above.

Furthermore, it should be understood that, unless otherwise specifically indicated, any relative positional or directional terms that may be used in the descriptions below—such as "upper," "lower," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device depicted in FIG. 2a, it should be understood that the back side 200b of the semiconductor wafer 200 is positioned at or near the "bottom" or "lower" surface of the wafer 200, and the front side 200f is positioned at or near the "top" or "upper" surface. Similarly, it should also be understood that the substrate 201 is positioned "below" or "under" the device layer 202, and the hardmask layer 207 is positioned "above" or "over" the contact structure layer 204. Additionally, the term "vertical" should be understood as being substantially perpendicular to the front and/or back faces 200f, 200b of the wafer 200, whereas the term "horizontal" should understood as being substantially parallel to the front and/or back faces 200f, 200b.

Figure 1D:
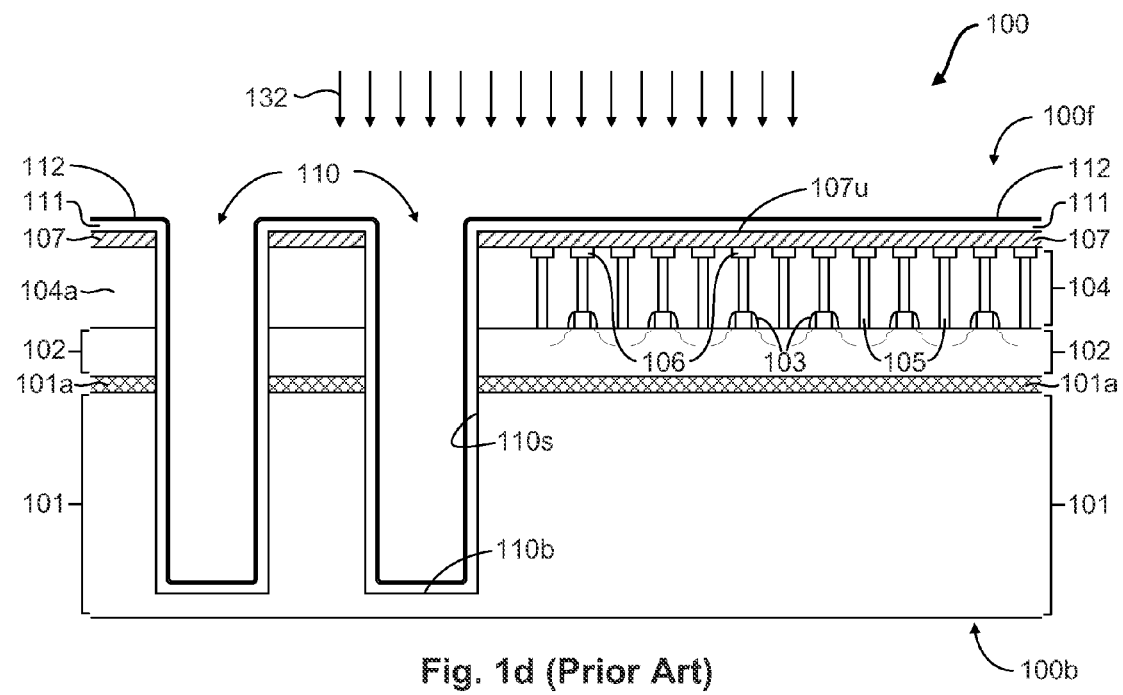
Figure 2A:
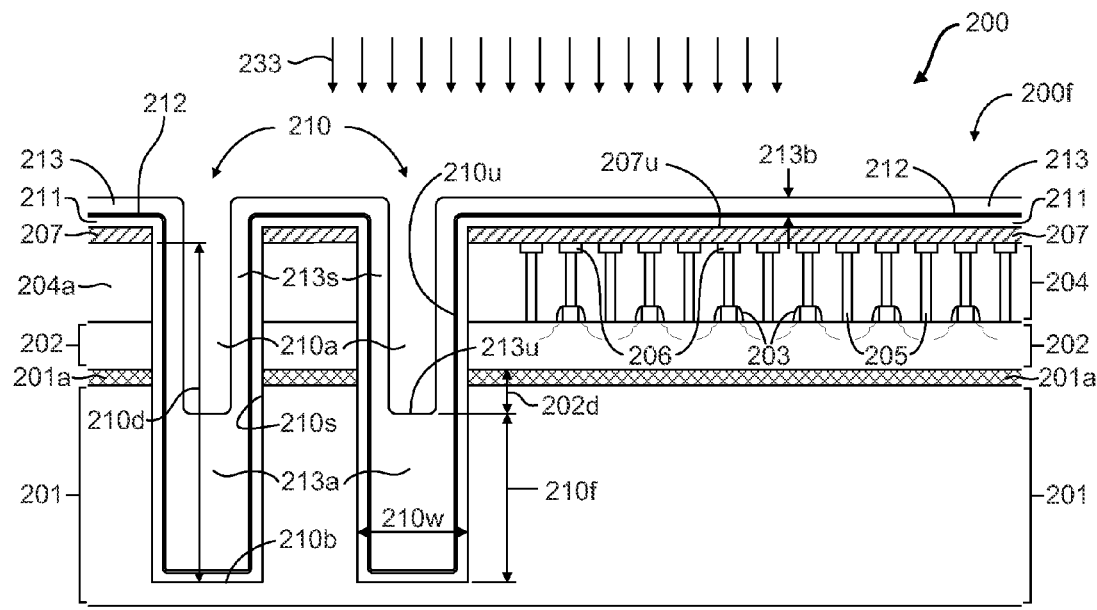
FIGS. 2a-2e schematically illustrate a process flow of an illustrative embodiment of forming TSV's in accordance with the subject matter disclosed herein.

FIG. 2a shows a schematic cross-sectional view of an illustrative semiconductor wafer 200 of the present disclosure that substantially corresponds to the wafer 100 illustrated in FIG. 1d as described above, wherein a patterned hardmask layer 207 has been formed above the wafer 200, and wherein TSV openings 210 having a total depth 210d have been formed through the contact structure layer 204, the device layer 202, the buried insulating layer 201a (if SOI architecture is used), and into the substrate 201. Additionally, FIG. 2a depicts a manufacturing stage wherein an isolation layer 211 and a first barrier layer 212 have been formed above the wafer 200, including the inside surfaces 210s and 210b of the TSV openings 210.

In accordance with the subject matter disclosed herein, at the manufacturing stage illustrated in FIG. 2a, a layer of first conductive contact material 213 may be formed above the wafer 200 so as to partially fill the TSV openings 210. In some embodiments, the layer of first conductive contact material 213 may partially fill each of the TSV openings 210 to a first height 210f above the bottom surface 210b, thereby forming a lower, or first, portion 213a of each hybrid TSV 220 (see FIG. 2e), wherein the first portion 213a may have an upper surface 213u located at the first height 210f. As shown in FIG. 2a, in one illustrative embodiment, the first height 210f may be located at approximately one-half of the total depth 210d of the TSV openings 210, and in certain embodiments the upper surface 213u may be located at a depth 202d below the device layer 202. In some embodiments of the present disclosure, the depth 202d may range from 1-20 μm, whereas in specific embodiments the depth 202d may range from 2-10 μm.

Depending on the overall TSV and chip design requirements, the first layer of conductive contact material 213 may be substantially comprised of copper, or may comprise an appropriate copper-based material alloy. In some illustrative embodiments, the first layer of conductive contact material 213 may be formed based on a substantially "bottom-up" deposition process 233, as previously described with respect to wafer 100 and FIG. 1e above. Additionally, a seed layer (not shown) may also be formed on the first barrier layer 212 prior to performing the deposition process 233, also as described in conjunction with FIG. 1e. However, as shown in FIG. 2a, the deposition process 233 may be performed only until the TSV openings 210 are partially filled to the first height 210f, and the first portions 213a of the hybrid TSV's 220 (see FIG. 2e) have been formed. Additionally, a sidewall portion 213s of the first layer of conductive contact material 213 may be formed along the upper sidewall 210u of the TSV openings 210, as well as outside of the TSV openings 210 and above the horizontal upper surface 207u of the hardmask layer 207. It should be noted that, as used herein, the term "along the upper sidewall 210u of the TSV opening 210" may refer to a sidewall portion 213s that is either formed directly on the upper sidewall 210u, or adjacent to the upper sidewall 210u with one or more intervening layers disposed between the sidewall portion 213s and the upper sidewall 210u.

Figure 1E:
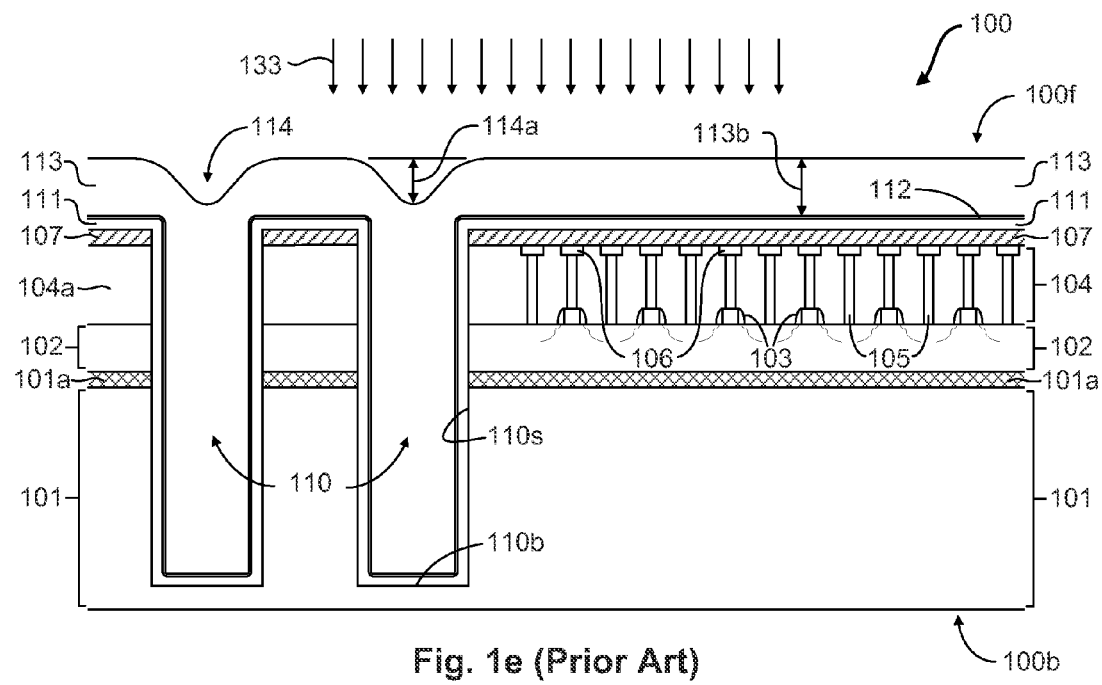
Figure 1F:
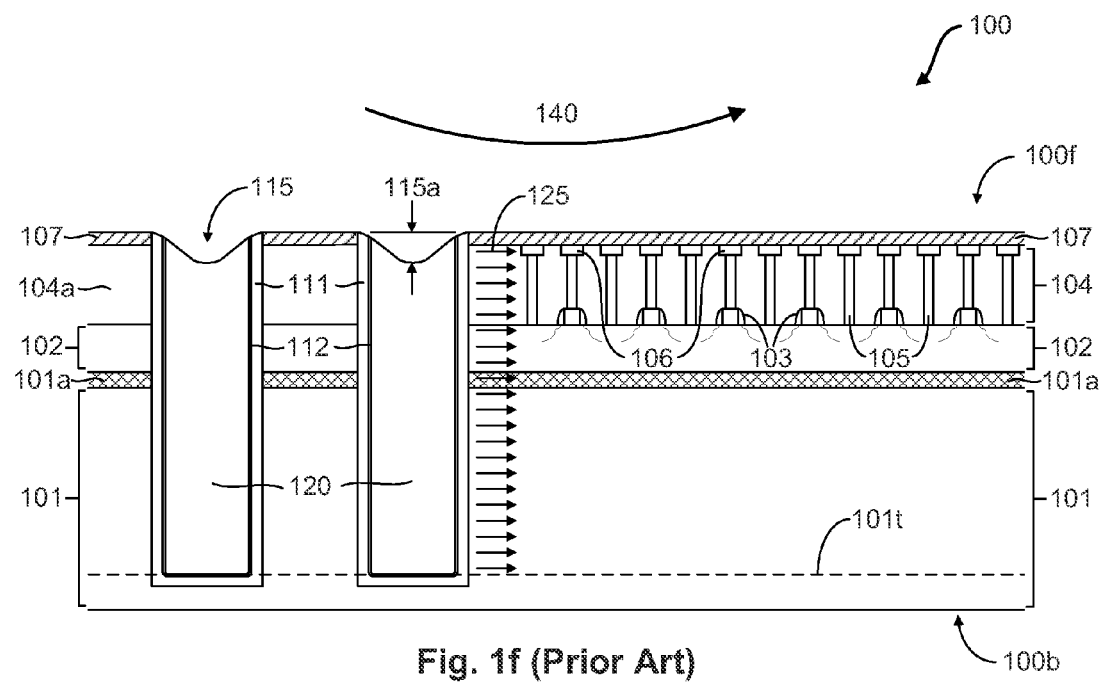

Moreover, since the deposition process 233 is adapted to only partially fill the TSV openings 210, in some illustrative embodiments the overburden 213b illustrated in FIG. 2a may be substantially less than the overburden 113b described above with respect to the prior art TSV process, and illustrated in FIG. 1e. For example, in certain embodiments of the presently disclosed subject matter, the overburden 213b may be on the order of 1-2 μm or even less, thereby potentially reducing the detrimental impact that a heavy overburden thickness may have on subsequently performed planarization processes.

Figure 2B:
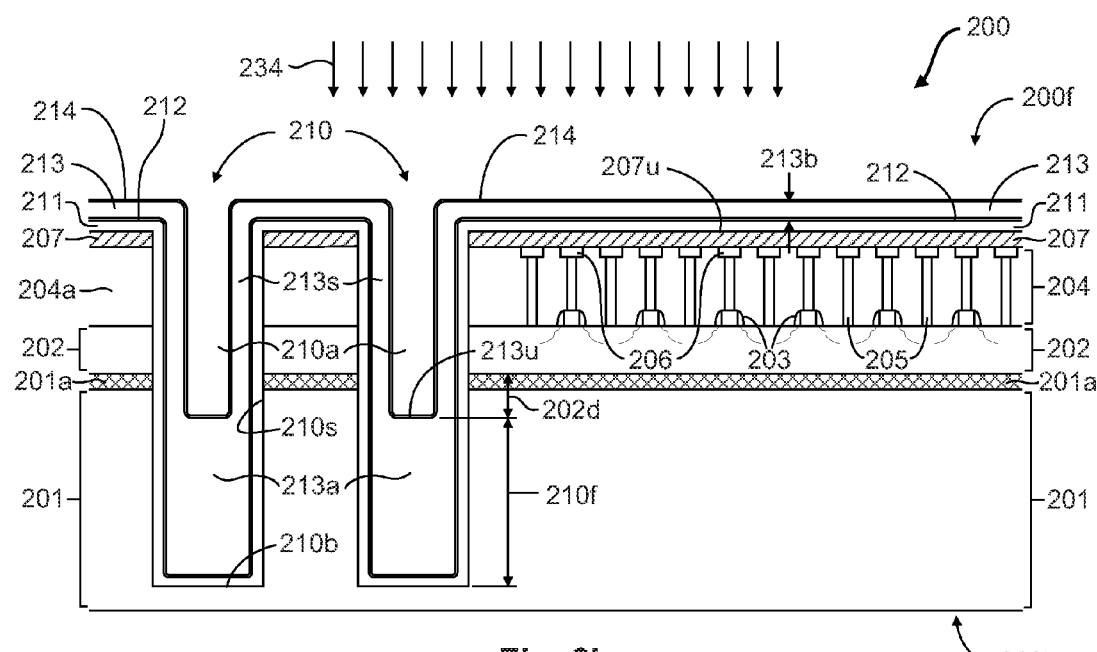

FIG. 2b depicts the illustrative wafer 200 shown in FIG. 2a in a further advanced manufacture stage, wherein an optional second barrier layer 214 may be formed above the first layer of conductive contact material 213, including inside of the unfilled portion 210a of each of the TSV openings 210. When provided, the second barrier layer 214 may act as an adhesion layer between the first layer of conductive contact material 213 and any subsequently formed layers of conductive contact material, thereby potentially enhancing that overall bond between the first portion 213a of each hybrid TSV 220 (see FIG. 2e) and a second portion of each TSV, as will be further discussed below. As with the barrier layer 112 described in conjunction with the prior art TSV process above, the optional second barrier layer 214 may be may be formed by performing a substantially conformal deposition process 234, such as CVD, PVD, ALD and the like. Furthermore, the material comprising the second barrier layer 214 may be as similarly described regarding barrier layer 112 (e.g., tantalum, tantalum nitride, titanium, titanium nitride, titanium silicon nitride, tungsten nitride, and the like), and the thickness of the second barrier layer 214 may similarly range from 2-20 nm.

Figure 2C:
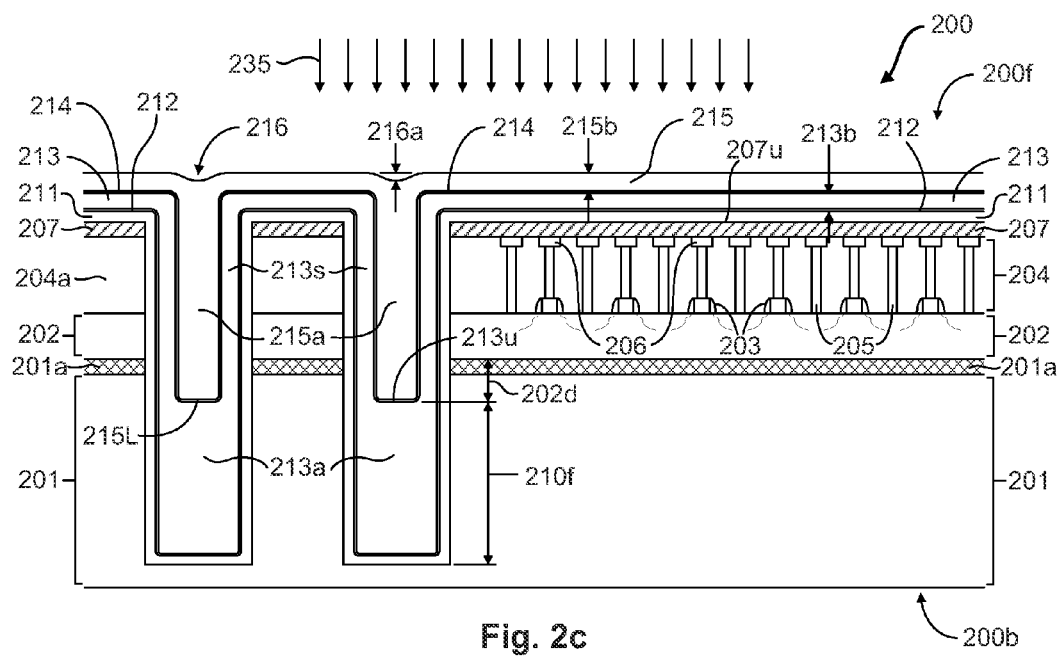

FIG. 2c shows an illustrative embodiment of the wafer 200 in yet a further advanced stage of manufacturing, wherein a second layer of conductive contact material 215 may be deposited above the wafer 200. As shown in FIG. 2c, the second layer of conductive contact material 215 may be formed so as to completely fill the unfilled portions 210a of the TSV openings 210, thereby forming an upper, or second, portion 215a of each hybrid TSV 220 (see FIG. 2e). In some illustrative embodiments, the second portion 215a of each hybrid TSV 220 may have a lower surface 215L conductively coupled, either directly or indirectly with the upper surface 213a of the first portion 213a of each hybrid TSV 220. For example, in certain embodiments the lower surface 215L of the second portion 215a may be in direct conductive contact with the upper surface 213u of the first portion 213, without any intervening conductive structures, conductive layers, or other conductive elements disposed therebetween. In such embodiments, the lower surface 215L may be substantially located at the same position relative to the bottom surface 210b of the TSV opening 210 as the upper surface 213u—i.e., at the first height 210f.

In other embodiments, the lower surface 215L of the second portion 215a of each hybrid TSV 220 may be indirectly conductively coupled to the upper surface 213u, wherein intervening conductive elements, such as the barrier layer 214 or other conductive structures (not shown) may be present between the lower surface 215L and the upper surface 213u of the first portion 213a. In such embodiments, the lower surface 215L of the second portion 215a may be located at a distance above the first height 210f. Additionally, and depending on the overall device requirements and the design parameters of the hybrid TSV's 220, the lower surface 215L of the second portion 215a may be located, in some illustrative embodiments, below the bottom of the device layer 202, whereas in other embodiments, the lower surface 215L may be located above the bottom of the device layer 202, or even above the bottom of the contact structure layer 204.

In some illustrative embodiments of the present disclosure, the second layer of conductive contact material 215 may be deposited by performing a conformal deposition process 235, recipes of which are well known in the art. The use of a substantially conformal deposition process 235, such as PVD, CVD, ALD, and the like, to deposit the second layer of conductive contact material 215 may facilitate forming the second portions 215a without trapping deposition-related defects, such as voids and the like, in the finished hybrid TSV's 220.

Also as shown in FIG. 2c, in some embodiments of the present disclosure, a portion of the second layer of conductive contact material 215 may also formed outside of the unfilled portions 210a of the TSV openings 210, resulting in an overburden 215b above the horizontal upper surface 207u of the hardmask layer 207. Depending on the deposition parameters employed during the conformal deposition process 235, in certain illustrative embodiments the overburden 215b may be substantially less than the overburden 213b associated with the process 233 used to deposit the first layer of conductive contact material 213 e.g., an electrochemical deposition process. Moreover, the depth 216a of any depressions 216 which may inadvertently be formed in the second layer of conductive contact material 215 above each of the TSV openings 210 may also be substantially less than a corresponding depression 114 associated with the prior art TSV process described above and illustrated in FIG. 1e. For example, in one illustrative embodiment, the depth 216a of depressions 216 may be less than one-half of the total overburden thicknesses 213b plus 215b. In some illustrative embodiments, the depth 216a may be less than 2 μm, and in specific embodiments may range between 100 nm to 1 μm, whereas in specific embodiments, the depth 216a may be greater 500 nm. Accordingly, any detrimental effect that may be attributable the depressions 216—which may be present in the second layer of conductive contact material 215 as a result of deposition-related issues associated with the deposition process 235—may potentially be reduced during the performance of any subsequent planarization processes, as will be discussed in further detail below.

In order to reduce the thermal stress effects caused by the differential thermal expansion between the hybrid TSV's 220 (see FIG. 2e) and the circuit elements 203 of the device layer 202 and/or the contact elements 205, 206 of the contract structure layer 204, the material comprising the second layer of conductive contact material 215 (and the second portion 215a of each hybrid TSV 220) may have a CTE that is less than that of the material comprising the first layer of conductive contact material 213 (and the first portion 213a of each hybrid TSV 220). In this way, the second portion 215a of each hybrid TSV 220 may act as a "thermal buffer" by potentially mitigating the differential thermal expansion effects caused by the TSV's during chip operation. Moreover, since the second portion 215a of each hybrid TSV 220 may in some illustrative embodiments extend to a depth 202d below the device layer 202, the "thermal buffer" effects of the second portion 215a may be focused in the area of greatest benefit—i.e., the contract structure layer 204, the device layer 202, and slightly therebelow.

As noted above, in some embodiments of the present disclosure, the first layer of conductive contact material 213 may comprise a material having a relatively high CTE, such as, for example copper (having a CTE of approximately 16.6 μm/m/° C.—see Table 1), whereas the second layer of conductive contact material 215 may have a substantially lower CTE that may be closer to that of the semiconductor-based materials typically used for forming semiconductor devices, such as integrated circuit elements 203. For example, in one illustrative embodiment, the first layer of conductive contact material 213 may comprise copper and the second layer of conductive contact material 215 may comprise tungsten (having a CTE of approximately 4.3 µm/m/° C.—see Table 1), thereby resulting in a CTE of the second layer 215 that is approximately 25% of the first layer 213, and substantially closer to that of silicon, silicon-germanium, silicon nitride, and the like. In another illustrative embodiment, the first layer of conductive contact material 213 may comprise copper and the second layer of conductive contact material 215 may comprise tantalum or titanium (have CTE's of approximately 6.5 and 8.6 µm/m/° C., respectively—see Table 1), resulting in a CTE of the second layer 215 that is approximately 50% or less of the first layer 213. In other illustrative embodiments, the second layer of conductive contact material may comprise platinum, cobalt, nickel and gold, each of which have a lower CTE than copper. Furthermore, alloys of each of the above-noted materials may also be employed, provided the CTE of the specific alloy is also less than that of the first layer of conductive contact material 213.

Figure 2D:
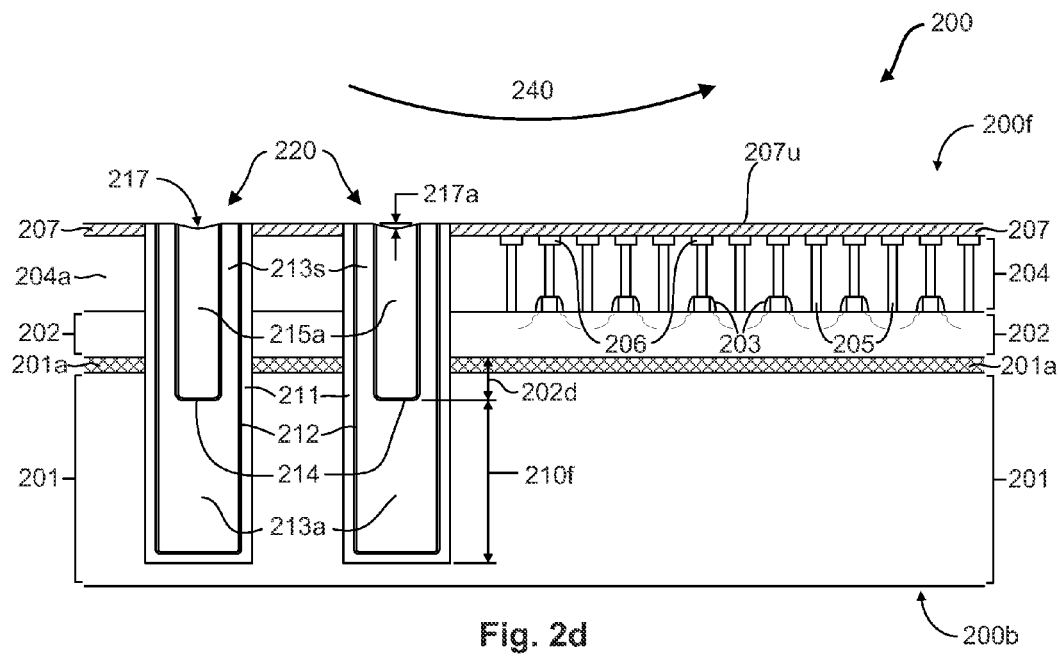

FIG. 2d shows the illustrative wafer 200 of FIG. 2c in a still further advanced manufacturing stage. As shown in FIG. 2d, a planarization process 240, such as a CMP process and the like, may be performed to remove the horizontal portions of the material layers formed outside of the TSV openings 210 from above the horizontal upper surface 207u of the hardmask layer 207. More specifically, the planarization process 240 may be adapted to substantially completely remove the horizontal portions of the second layer of conductive contact material 215, the optional second barrier layer 214 (if used), the first layer of conductive contact material 213, the first barrier layer 212, and the isolation layer 211 from above the hardmask layer 207. Moreover, the thickness of the hardmask layer 207—which as discussed previously with respect to the prior art TSV process may act as a CMP stop layer—may also be reduced during the planarization process 240.

As noted previously, the combined effects of the relative reduction of the total overburden thicknesses 213b plus 215b and any depressions 216 that may be formed above the TSV openings 210 may, in some illustrative embodiments, reduce the overall effectiveness of the planarization process 240. For example, some amount of CMP "dishing"—described above with respect to the prior art TSV process and illustrated in FIG. 1f—may occur as a result of employing overly aggressive CMP parameters during the planarization process 240. As shown in FIG. 2d, aggressive CMP parameters may cause the presence of the any depressions 216 (see FIG. 2c) in the second layer of conductive contact material 215 to translate into a dished region 217 having a depth 217a at the upper end of each hybrid TSV 220 after completion of the planarization process 240. However, in accordance with various illustrative embodiments disclosed herein, these detrimental effects may be mitigated in some respects for at least the following reasons: since the total overburden thicknesses 213b plus 215b, as well as the depth 216a of depressions 216, may be substantially less than the corresponding conditions described with respect to the prior art TSV process above, the CMP parameters used during the planarization process 240 may be significantly less aggressive than those employed during the prior art planarization process 140. Accordingly, the depth 217a of the dished regions 217 may be substantially less than the depth 115a of the corresponding dished regions 115. For example, in some illustrative embodiments, the depth 217a may be less than approximately 100 nm, and in certain embodiments may be as little as 50 nm, or even less. Moreover, due at least in part to the reduced depth 217a, the likelihood that the presence of the dished regions 217 in the hybrid TSV's 220 may translate into additional defects in subsequently formed metallization layers may also be substantially reduced.

Figure 2E:
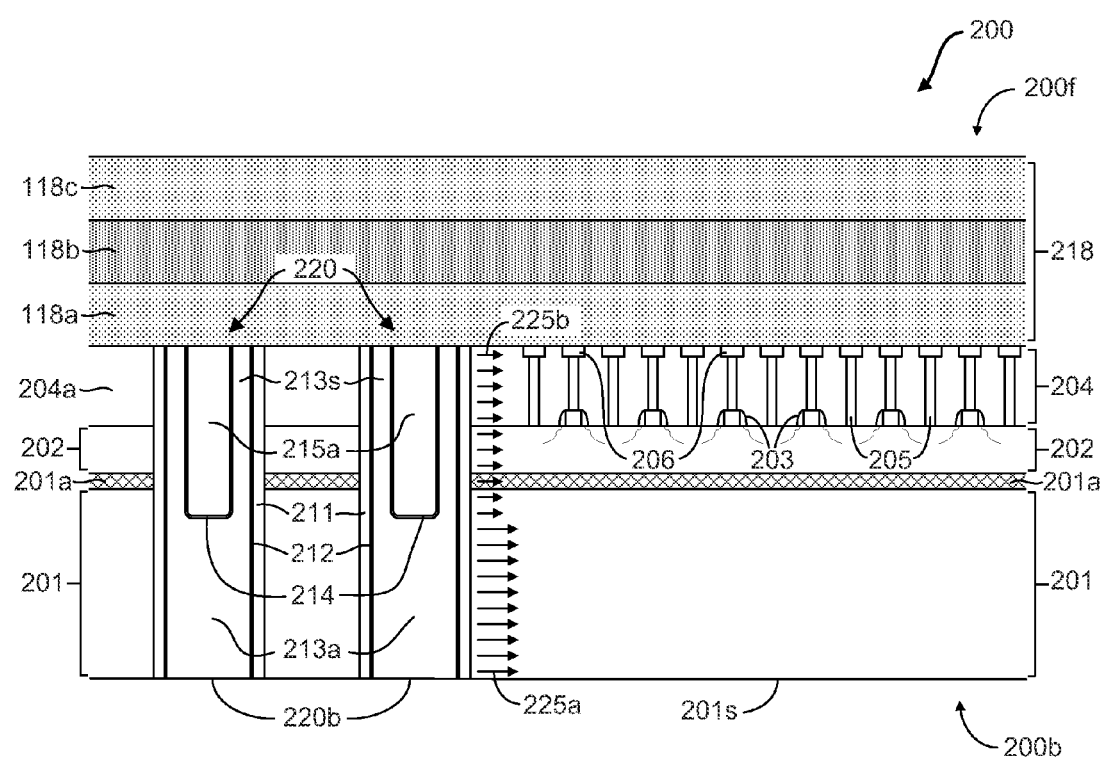

FIG. 2e depicts the illustrative wafer 200 of FIG. 2d in yet another advanced manufacture stage. After completion of the planarization process 240, additional processing of the front side 200f of the wafer 200 may be performed. For example, as shown in FIG. 2e, in some illustrative embodiments the hardmask layer 207 may be removed using a suitable selective etch recipe, or by continuation of the planarization process 240. Furthermore, a metallization system 218 comprising a plurality of metallization layers 218a, 218b, 218c, etc. may be formed above the hybrid TSV's 220 and the contact structure layer 204 so as to provide electrical interconnects between the circuit elements 203, the hybrid TSV's 220, and any one of a plurality of additional stacked semiconductor chips that may eventually be bonded and electrically connected to the wafer 200. Thereafter, the wafer 200 may be thinned from the back side 200b so as to reduce the thickness of the substrate 201 (indicated in FIG. 2e by surface 201s) and thereby expose the bottom surfaces 220b of the hybrid TSV's 220 in preparation for wafer stacking and substrate bonding—i.e., 3D integrated circuit assembly. This back-side thinning operation may be accomplished by performing one or more of a grinding, etching, and/or polishing process so as to provide a thinned substrate 201 having a predetermined thickness, wherein the predetermined thickness may, in certain illustrative embodiments, depend on the eventual purpose or application for which the wafer 200 may be used in an overall stacked chip design.

Additionally, it should be noted that the "thermal buffer" effects provided by the hybrid TSV's 220 may, in certain embodiments, result in a substantially modified thermal stress field in the areas adjacent to the hybrid TSV's 220. In some illustrative embodiments of the presently disclosed subject matter, when the second portions 215a of the hybrid TSV's 220 comprises a material having a reduced CTE as compared to the first portions 213a, the thermal stresses imparted by the second portion 215a to the upper layers of the wafer 200 adjacent to the second portions 215a—e.g., the device layer 202 and the contact structure layer 204—may be significantly reduced. For example, as shown in FIG. 2e, the lower effective CTE of the combined second portions 215a and sidewall portions 213s may result in a lower induced thermal stress 225b on the device and contact structure layers 202, 204 adjacent to the upper portion of the hybrid TSV's 220. On the other hand, the higher CTE of the first portions 213a of the hybrid TSV's 220 may cause commensurately higher thermal stresses 225a in the substrate region 201 of the wafer 200 adjacent to the lower portion of the hybrid TSV's 220, as a result of the significant CTE mismatch between the material comprising the first portions 213a and the semiconductor material of the substrate 201. However, since, in accordance with the present disclosure, the relatively higher thermal stresses 225a may be largely restricted by the design of the hybrid TSV's 220 to a region below the device layer 202, the potentially detrimental effects of the thermal stress field induced in the area of the hybrid TSV's 220 may be substantially mitigated.

As a result, the subject matter disclosed herein provides various embodiments of hybrid through-silicon vias (TSV's) having a reduced thermal stress effect on surrounding circuit elements, and techniques for forming these TSV's. While these techniques may be of particular advantage for TSV's having a width of 10 µm and a depth of 50 µm or more, these techniques may be successfully employed for TSV openings having significantly smaller dimensions. Moreover, while some of the embodiments described above are directed to hybrid TSV's comprising copper and tungsten, the devices and methods disclosed herein may also be used with other materials, provided the CTE parameters described above are applied—that is, wherein the portion of the hybrid TSV adjacent to and extending above the device layer of a wafer has a coefficient of thermal expansion that is less than the CTE of the remaining portion of the hybrid TSV extending below the device layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor chip, comprising:
    a substrate;
    a semiconductor layer positioned above said substrate; and
    a hybrid through-silicon via ("TSV") extending continuously through at least said semiconductor layer and said substrate, said hybrid TSV comprising:
        a first TSV portion comprising a first conductive contact material, wherein said first TSV portion comprises a lower portion that is positioned in said substrate and has a lower surface that is positioned adjacent to a back side of said substrate and an upper surface that is positioned below said semiconductor layer, said first TSV portion further comprising upper sidewall portions that extend from said upper surface of said lower portion through at least said semiconductor layer, wherein a depth of said lower portion between said upper and lower surfaces is greater than a thickness of said upper sidewall portions; and
        a second TSV portion comprising a second conductive contact material, wherein said second TSV portion is conductively coupled to said first TSV portion, is laterally surrounded by said upper sidewall portions, and extends continuously from said upper surface of said lower portion through at least said semiconductor layer.

2. The semiconductor chip of claim 1, further comprising an isolation layer positioned at least between said first TSV portion and said substrate and between said first TSV portion and said semiconductor layer.

3. The semiconductor chip of claim 2, further comprising a barrier layer positioned between said isolation layer and said first TSV portion.

4. The semiconductor chip of claim 1, wherein said first conductive contact material has a first coefficient of thermal expansion and said second conductive contact material has a second coefficient of thermal expansion that is less than said first coefficient of thermal expansion.

5. The semiconductor chip of claim 4, wherein said second coefficient of thermal expansion is less than approximately 50% of said first coefficient of thermal expansion.

6. The semiconductor chip of claim 1, wherein said first conductive contact material comprises copper and said second conductive contact material comprises tungsten.

7. The semiconductor chip of claim 1, wherein a width of said hybrid TSV is in a range of approximately 1-10 μm.

8. The semiconductor chip of claim 1, wherein said semiconductor layer is a device layer of said semiconductor chip, a plurality of semiconductor devices being positioned in and above said device layer.

9. The semiconductor chip of claim 1, further comprising an interlayer dielectric layer positioned above said semiconductor layer, wherein said upper sidewall portions of said first TSV portion further extend continuously through said interlayer dielectric layer.

10. The semiconductor chip of claim 9, wherein said semiconductor layer is a device layer of said semiconductor chip and wherein said interlayer dielectric layer is a contact structure layer of said semiconductor chip, a plurality of semiconductor devices being positioned in and above said device layer and a plurality of contact elements being positioned in said contact structure layer.

11. The semiconductor chip of claim 9, wherein a plurality of semiconductor devices are positioned in and above said device layer and a plurality of contact elements are positioned in said contact structure layer.

12. The semiconductor chip of claim 1, wherein said lower surface of said lower TSV portion is exposed at a back side of said substrate.

13. The semiconductor chip of claim 1, further comprising a buried insulating layer positioned between said substrate and said semiconductor layer.

14. The semiconductor chip of claim 1, wherein a barrier layer is positioned between said first TSV portion and said second TSV portion.

15. A semiconductor chip comprising a hybrid through-silicon via ("TSV"), the hybrid TSV comprising:
    a first lower TSV portion comprising a first conductive contact material having a first coefficient of thermal expansion and being positioned in a substrate of said semiconductor chip, said first lower TSV portion having a lower surface that is exposed at a back side of said substrate and an upper surface that is positioned below a device layer of said semiconductor chip;
    a first upper TSV portion comprising sidewall portions that extend above said upper surface of said first lower TSV portion and through at least said device layer and a contact structure layer of said semiconductor chip positioned above said device layer, wherein a depth of said first lower TSV portion between said upper and lower surfaces thereof is greater than a thickness of said sidewall portions; and
    a second TSV portion conductively coupled to said first upper and lower TSV portions, said second TSV portion comprising a second conductive contact material having a second coefficient of thermal expansion that is less than said first coefficient of thermal expansion, wherein said second TSV portion is laterally surrounded by said sidewall portions of said first upper TSV portion and extends continuously above said upper surface of said first lower TSV portion through at least said device layer and said contact structure layer.

16. The semiconductor chip of claim 15, further comprising an isolation layer laterally surrounding an entirety of said hybrid TSV.

17. The semiconductor chip of claim 16, further comprising a barrier layer positioned between said isolation layer and said hybrid TSV.

18. The semiconductor chip of claim 15, wherein said second coefficient of thermal expansion is less than approximately 50% of said first coefficient of thermal expansion.

19. The semiconductor chip of claim 15, wherein said first conductive contact material comprises copper and said second conductive contact material comprises tungsten.

20. A semiconductor chip, comprising:
- a substrate;
- a semiconductor layer positioned above said substrate;
- an interlayer dielectric layer positioned above said semiconductor layer; and
- a hybrid through-silicon via ("TSV") extending continuously through an entirety of said interlayer dielectric layer, said semiconductor layer and said substrate, said hybrid TSV comprising:
  - a lower TSV portion positioned entirely in a lower portion of said substrate and having a lower surface that is exposed at a back side of said substrate and an upper surface that is positioned below said semiconductor layer, said lower TSV portion comprising a first conductive material having a first thermal expansion coefficient; and
  - an upper TSV portion extending from said upper surface of said lower TSV portion through an upper portion of said substrate and through an entirety of said semiconductor layer and an entirety of said interlayer dielectric layer, said upper TSV portion comprising an inner core portion and an outer layer portion surrounding an entirety of said inner core portion, wherein a depth of said lower TSV portion measured between said upper and lower surfaces thereof is greater than a lateral thickness of said outer layer portion of said upper TSV portion, said outer layer portion comprising said first conductive material and said inner core portion comprising a second conductive material having a second thermal expansion coefficient that is less than approximately 50% of said first thermal expansion coefficient.

* * * * *